(12) United States Patent
Brown

(10) Patent No.: US 6,197,373 B1
(45) Date of Patent: Mar. 6, 2001

(54) GAS INJECTION METHODS FOR A LPCVD FURNACE

(75) Inventor: Patrick G. Brown, Vancover, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/374,788

(22) Filed: Aug. 16, 1999

Related U.S. Application Data

(62) Division of application No. 09/089,739, filed on Jun. 3, 1998, now Pat. No. 6,027,569.

(51) Int. Cl.[7] .................................................. C23C 16/00
(52) U.S. Cl. .................................. 427/248.1; 427/255.11; 118/715; 118/725
(58) Field of Search ........................... 427/248.1, 255.11; 118/715, 724, 725

(56) References Cited

U.S. PATENT DOCUMENTS

| | | | |
|---|---|---|---|
| 4,699,805 | * | 10/1987 | Seelbach et al. ........................ 118/733 |
| 4,756,272 | * | 7/1988 | Kessler et al. ........................ 118/715 |
| 4,793,283 | * | 12/1988 | Sarkozy ................................ 118/715 |
| 4,989,540 | * | 2/1991 | Fuse et al. . |
| 5,076,206 | * | 12/1991 | Bailet et al. . |
| 5,318,633 | * | 6/1994 | Yamamoto et al. . |
| 5,409,539 | * | 4/1995 | Turner et al. ........................ 118/715 |
| 5,482,559 | * | 1/1996 | Imai et al. . |
| 5,584,934 | * | 12/1996 | Lin . |
| 5,616,025 | * | 4/1997 | Choi et al. . |
| 5,906,861 | * | 5/1999 | Mack et al. ....................... 427/255.38 |

* cited by examiner

Primary Examiner—Shrive Beck
Assistant Examiner—Bret Chen
(74) Attorney, Agent, or Firm—Alston & Bird LLP

(57) ABSTRACT

Systems and methods disclosed provide a LPCVD furnace which includes a lower gas injection tube that enters a quartz tube of the LPCVD furnace at a lower portion thereof, and extends toward the upper portion of the quartz tube. Thus, the lower gas injection tube extends a shorter distance within the quartz tube than a conventional injection tube attached to the bell-shaped end of the quartz tube. A LPCVD furnace in accordance with the invention comprises a quartz tube having an interior chamber which includes an upper portion (adjacent a belled end) and a lower portion (adjacent a flanged end), and a gas injection tube for injecting a gas into the interior chamber of the quartz tube, wherein the gas injection tube enters the interior chamber of the quartz tube at the lower portion thereof and extends toward the upper portion thereof. A pedestal for supporting a wafer boat may be positioned at the lower portion of the interior chamber, and configured to receive the gas injection tube.

10 Claims, 2 Drawing Sheets

GAS INJECTION METHODS FOR A LPCVD FURNACE

CROSS REFERENCE TO RELATED APPLICATIONS

This patent application is a divisional of U.S. patent application Ser. No. 09/089,739, filed Jun. 3, 1998, now U.S. Pat. No. 6,027,569, entitled "Improved Gas Injection Methods and Systems for a LPCVD Furnace."

FIELD OF THE INVENTION

The present invention generally relates to the manufacture of wafers, and more particularly, to an improved low pressure chemical vapor deposition (LPCVD) furnace for use in wafer manufacturing.

BACKGROUND OF THE INVENTION

A well recognized problem in the manufacture of a semiconductor device on a silicon wafer is the generation of impurities in a portion of the silicon wafer which becomes an active region of the semiconductor device. The impurities in the active regions of the semiconductor device may degrade the operational characteristics of the device, and may reduce total yield. A technique for reducing the impurities in the vicinity of the active regions involves collecting the impurities in portions of the silicon wafer remote with respect to the active regions. This technique is commonly referred to as gettering.

An illustrative gettering technique referred to as polysilicon back seal (PBS) is the formation of a polycrystalline silicon layer as a gettering layer on the opposed major surfaces of a silicon wafer. The polycrystalline silicon layer is typically formed by growing polycrystalline silicon on the silicon wafer utilizing a low pressure chemical vapor deposition (LPCVD) method. The grain size difference between the silicon wafer and the polycrystalline layer causes stress in the structure which acts as a "getter" that draws nearby impurities to the sites of stress. The silicon wafer can then have one side polished such that the resulting wafer has one major surface that has a polycrystalline silicon layer and the other major surface is substantially free of impurities.

In order to grow the polycrystalline silicon layer on a silicon wafer, a LPCVD furnace may be utilized. LPCVD furnaces have been widely used in the microelectronics industry for years for thin film deposition and other thermal processing steps required in the manufacture of integrated circuits. The evolution of these furnaces has largely been driven by the need for improved process uniformity and high wafer throughput. The need for high process uniformity refers to both wafer-to-wafer and within-wafer uniformity. An example of a commercially available LPCVD furnace is Model 7000+ by Thermco Systems, Orange, Calif., USA. In general, advantages of LPCVD techniques may include uniform step coverage, precise control of composition and structure, low temperature processing, fast deposition rates, high throughput, and low processing cost.

A vertical LPCVD furnace typically includes a vertically positioned bell-shaped quartz tube that is approximately 40 inches in length. Within the quartz tube, a quartz pedestal located at the bottom of the quartz tube supports a wafer boat holding any number of horizontally positioned silicon wafers. In order to grow polycrystalline layers on the silicon wafers within the quartz tube, the furnace is heated and one or more deposition gases, such as silane ($SiH_4$), are introduced into the quartz tube. The deposition gases are typically introduced through both an upper gas injection tube and a lower gas injection tube. The upper gas injection tube enters the quartz tube at its belled end, and typically extends a couple of inches into the interior chamber of the quartz tube, if it extends into the interior chamber at all. The lower gas injection tube also enters the quartz tube at its belled end, and typically extends approximately 30 or more inches in the quartz tube toward the bottom of the quartz tube. Thus, an inlet at the distal end of the lower gas injection tube is proximate the bottom of the wafer boat. An illustrative example of a conventional LPCVD furnace is provided in U.S. Pat. No. 5,076,206 to Bailey et al.

Accordingly, the deposition gases may be introduced simultaneously into the quartz tube near the top and bottom of the wafer boat by means of the upper and lower gas injection tubes respectively. This facilitates substantially uniform growth of the polycrystalline layer on silicon wafers. In operation, silane flows into the heated quartz tube via the upper gas injection tube and the lower gas injection tube. The silane gas is heated as it enters the quartz tube and deposits on the surfaces of the silicon wafers to form a polycrystalline layer on the exposed surfaces of the respective silicon wafers.

Over time, however, silane deposits on the inside surfaces of the lower gas injection tube, which will restrict the flow of silane into the quartz tube. The lower gas injection tube experiences a greater amount of deposition than the upper gas injection tube because of its length. As a consequence, the precision with which predetermined quantities of silane are introduced into the quartz tube by the lower gas injection tube may be reduced.

The build up of silane on the lower gas injection tube also contributes to the premature breaking or cracking of the injection tube due to, among other reasons, differences in the coefficients of thermal expansion between the quartz tube and the material which forms within the injection tube. In addition, the cracking and breaking of the lower injection tube may require expensive maintenance and repair, and may ultimately reduce yield.

Further, the fabrication of the lower gas injection tube requires a relatively high degree of skill and precision, and therefore, is a costly component of the quartz tube. In particular, the lower gas injection tube is connected to the quartz tube at the bell-shaped portion of the quartz tube, which makes it difficult to attach the lower gas injection tube to the quartz tube. The length and positioning of the injection tube within the quartz tube requires precise alignment in order to have the tube run parallel with the wall of the quartz tube. Thus, the lower gas injection tube is a critical design feature of any quartz tube that is being utilized in polysilicon backseal operations.

Therefore, an unresolved need exists in the industry for a LPCVD furnace capable of injecting a deposition gas at the upper and lower portions of a quartz tube while advantageously reducing maintenance and fabrication cost while increasing yield.

SUMMARY OF THE INVENTION

In view of the above discussion, it is an object of the present invention to provide an improved low pressure chemical vapor deposition (LPCVD) furnace.

Another object of the present invention is to provide a LPCVD furnaces with an improved quartz tube using an improved lower gas injection tube for polysilicon back seal operations.

Yet another object of the present invention is to provide a lower gas injection tube for a LPCVD furnace that is relatively inexpensive to fabricate and robust in operation.

These and other objects are accomplished according to the present invention by systems and methods that provide a LPCVD furnace which includes a quartz tube and a lower gas injection tube that enters a lower portion of the quartz tube and that extends toward an upper portion of the quartz tube. Therefore, a lower gas injection tube in accordance with the present invention extends a shorter distance within the quartz tube than a conventional lower gas injection tube that is attached to and extends downward from the bell-shaped end of a quartz tube.

For instance, in a preferred embodiment, a lower gas injection tube in accordance with the present invention extends less than 20 inches and, more typically, approximately 10 inches inside of the quartz tube, as compared to a conventional lower gas injection tube attached to the belled end of the quartz tube which typically extends more than 30 inches within the quartz tube. Consequently, polysilicon film buildup on the interior surfaces of the injection tube may be reduced because of the shorter length of the injection tube and the lower temperature of the injection tube since it is out of the heating element zones. The reduced polysilicon film buildup may likewise reduce breaks and cracks in the injection tube, and thereby, reduce the maintenance and repair associated with a LPCVD furnace. The reduced length of the lower gas injection tube may also decrease the volume of deposition gas required for adequate growth since less polysilicon film is deposited in the injection tube. In addition, because the lower gas injection tube enters through the lower portion of the quartz tube and is mounted to a side wall of the quartz tube rather than the curved bell portion at the top of the quartz tube, a quartz tube in accordance with the present invention may be less expensive to fabricate.

In an embodiment of the present invention, a LPCVD furnace comprises a quartz tube having an interior chamber which includes an upper portion (adjacent a belled end) and a lower portion (adjacent a flanged end), and a gas injection tube for injecting a gas into the interior chamber of the quartz tube, wherein the gas injection tube enters the interior chamber of the quartz tube at the lower portion thereof and extends toward the upper portion thereof. A pedestal for supporting a wafer boat may be positioned at the lower portion of the interior chamber, and configured to receive the gas injection tube.

The pedestal may include a first end plate and a second end plate, and a plurality of rods extending from the first end plate to the second end plate. A cover may wrap around those portions of the rods adjacent to the first end plate, and extend at least partially along the lengths of the rods from the first end plate toward the second end late. An outwardly facing channel in the cover and a corresponding notch in the first end plate may be provided to receive the injection gas tube.

The gas injection tube may include a proximal end where the injection tube enters the interior chamber of the quartz tube, and a distal end that provides an inlet at which the deposition gas enters the interior chamber. The inlet of the gas injection tube may be configured to inject the deposition gas into the interior chamber in a direction essentially toward an interior surface of the quartz tube.

Preferably, the lower gas injection tube extends a distance less than approximately 20 inches within the interior chamber of the quartz tube. Stated another way, the lower gas injection tube preferably extends a distance less than approximately one-third the longitudinal length of the quartz tube within the interior chamber of the quartz tube.

In addition, the LPCVD furnace may include a heating element assembly that substantially surrounds the quartz tube for providing the requisite heat for the LPCVD process. The heating element assembly envelops the belled end of the quartz tube and extends to a bottom portion that is adjacent the lower portion of the interior chamber. The injection gas tube may enter the quartz tube at a point below the bottom portion of the heating element assembly, and extend above the bottom portion of the heating element assembly within the quartz tube.

In accordance with another advantageous aspect of the present invention, a pedestal for supporting a wafer boat in a LPCVD furnace, may comprise a first end plate and a second end plate connected by a plurality of rods extending from the first end plate to the second end plate. A cover may surround those portions of the rods adjacent the first end plate and extend only partially from the first end plate toward the second end plate to thereby define a space between the cover and the second end plate. The cover may include an outwardly facing channel for receiving the lower gas injection tube. Correspondingly, the first end plate can define a notch aligned with the outwardly facing channel of the cover for permitting the lower gas injection tube to pass therethrough.

In accordance with another aspect of the present invention, a method for injecting a gas into a quartz tube of a LPCVD furnace, wherein the quartz tube includes an interior chamber having a lower portion and an upper portion, may comprise the steps of providing a gas injection tube that enters the quartz tube at the lower portion and extends toward the upper portion of the interior chamber, placing a plurality of wafers in the quartz tube, applying heat to the quartz tube, and injecting the gas into the quartz tube utilizing the gas injection tube. As such, the gas will flow upwardly through the gas injective prior to injection into the interior chamber. The method may further include a step of providing a pedestal positioned at the lower portion of the interior chamber for supporting a wafer boat holding the plurality of wafers and configured to receive the gas injection tube.

Other features and advantages to the present invention will become apparent to one skilled in the art upon examination of the following drawings and detailed description. It is intended that all such features and advantages be included herein within the scope of the present invention, as defined by the appended claims.

BRIEF DESCRIPTION OF THE DRAWINGS

The present invention can be better understood with reference to the following drawings. The elements of the drawings are not necessarily drawn to scale, emphasis instead being placed upon clearly illustrated principles of the present invention. Furthermore, like reference to numerals designate corresponding parts throughout the several views.

DETAILED DESCRIPTION OF PREFERRED EMBODIMENTS

The present invention will now be described more fully hereinafter with reference to the accompanying drawings, in which preferred embodiments of the invention are shown.

This invention may, however, be embodied in different forms and should not be construed as limited by the embodiment set forth herein. Rather these embodiments are provided so that this disclosure will be thorough and complete, and will fully convey the scope of the invention to those skilled in the art.

Figure 1:
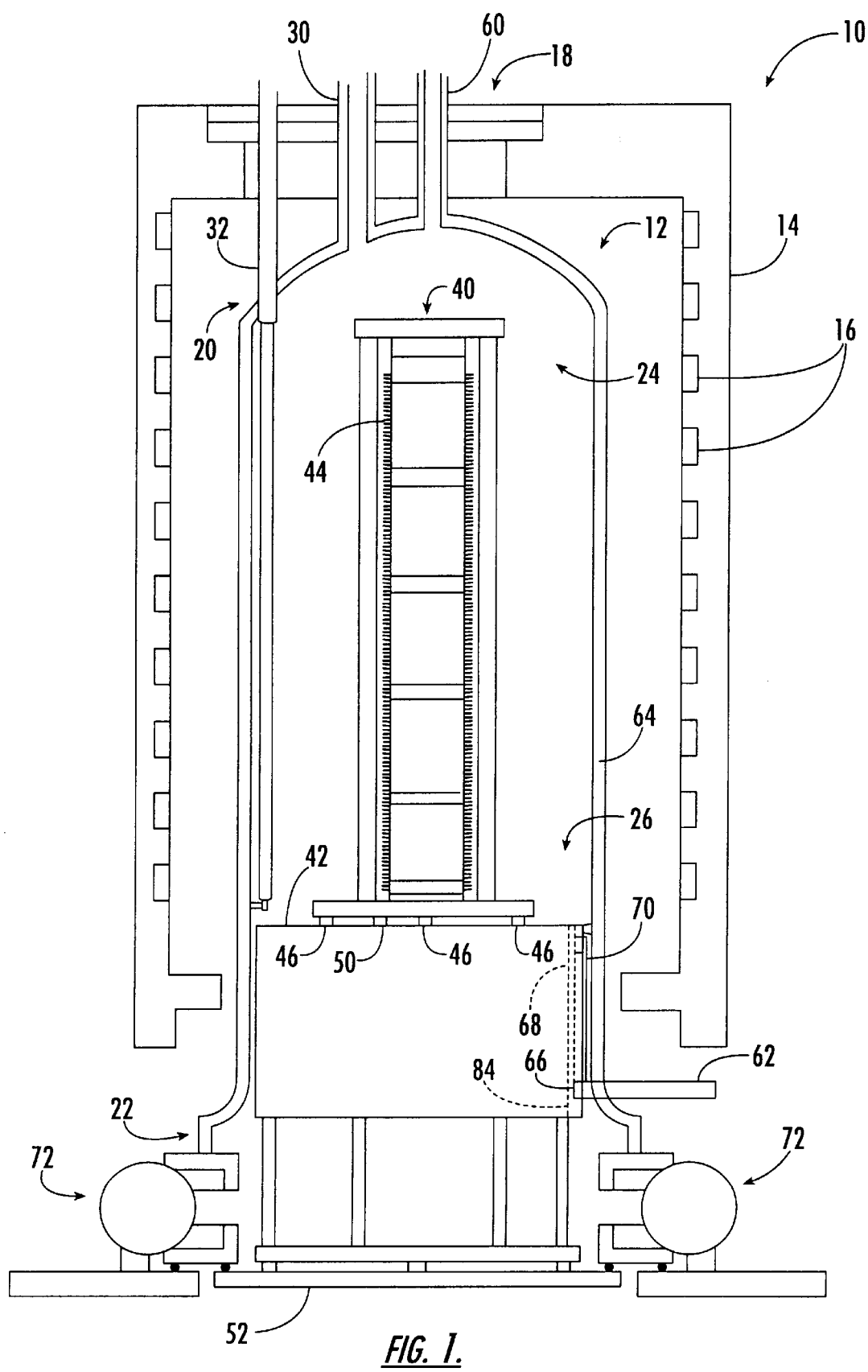
FIG. 1 shows a vertical low pressure chemical vapor deposition (LPCVD) furnace in accordance with one embodiment of the present invention.

With reference to FIG. 1, illustrated is a vertical low pressure chemical vapor deposition (LPCVD) furnace 10 in accordance with one embodiment of the present invention. The LPCVD furnace 10 comprises a bell-shaped quartz tube 12 substantially surrounded by a heating element assembly 14. The heating element assembly 14 includes a plurality of heating elements 16 which heat the quartz tube 12. An upper tube insulating block 18 reduces the loss of heat at the top of the LPCVD furnace 10, and provides for the passage of various tubes associated with the LPCVD furnace 10.

In an exemplary embodiment, the quartz tube 12 is approximately 40 inches in length, with an outside diameter of approximately 11 inches. It will be appreciated by one of ordinary skill in the art, however, that the dimensions provided herein do not affect the operation present invention. The quartz tube 12 is typically fabricated from clear fused quartz with a bell-shaped (i.e., belled) end 20 and an opposite flanged end 22. The inside of the quartz tube 12 forms an interior chamber, also referred to as a reaction chamber, having an upper portion 24 and a lower portion 26.

A pressure sensor tube 30 is attached at the belled end 20 of the quartz tube 12 and opens into the interior chamber for monitoring the pressure within the interior chamber of the quartz tube 12. The pressure sensor tube 30 is coupled to a pressure sensor (not shown) such as a baratron. In addition, a thermocouple sheath 32 also is attached to the belled end of the quartz tube 12. The thermocouple sheath also includes a tube that extends downwardly along a sidewall of the quartz tube for monitoring the temperature within the interior chamber of quartz tube 12.

A quartz wafer boat 40 is positioned within the interior chamber of quartz tube 12, and is supported by a quartz pedestal 42. The quartz wafer boat 40 holds a plurality of silicon wafers 44 for processing within the LPCVD furnace 10. The silicon wafers are stacked horizontally within wafer boat 40 in vertically-spaced relation, as is well known in the industry. The wafer boat 40 preferably is comprised of clear fused quartz, though other materials may be used such as recrystallized silicon carbide.

Figure 2:
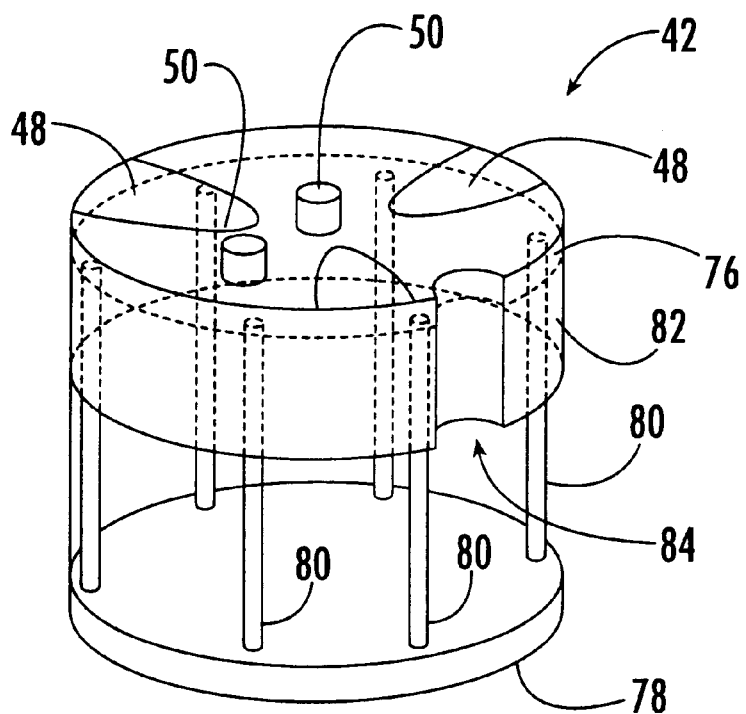
FIG. 2 shows a perspective view of a pedestal according to one embodiment of the present invention configured for use in the LPCVD furnace illustrated in FIG. 1.
Figure 3:
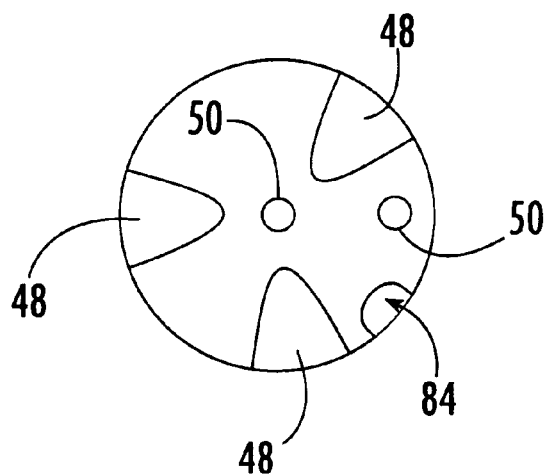
FIG. 3 is a top plan view of the pedestal of FIG. 2.

The wafer boat 40 is supported on the pedestal 42 by a plurality of feet 46 mounted to the base of the wafer boat. As shown in FIGS. 2 and 3, the pedestal preferably includes leveling recesses 48 which receive the feet of the wafer boat, as described in further detail below. The pedestal also preferably includes one or more alignment pins 50 which engage respective openings in the base of the wafer boat so as to align the wafer boat relative to the pedestal and, in turn, relative to the quartz tube. The pedestal 42 rests on a elevator door 52 which can be selectively raised and lowered for positioning wafer boat 40 and pedestal 42 within the interior chamber of quartz tube 12.

The quartz tube includes an upper gas injection tube 60 and a lower gas injection tube 62 to supply deposition gases such as silane ($SiH_4$) into the interior chamber of the quartz tube 12. The upper gas injection tube 60 is attached to the quartz tube 12 at the belled end 20 for injecting a deposition gas into the upper portion 24 of the interior chamber of the quartz tube 12. Though the upper gas injection tube 60 is not shown to extend into the interior chamber of the quartz tube 12, it will be appreciate by one of ordinary skill in the art that the upper gas injection tube 60 may extend several inches into the interior chamber, if desired.

The lower gas injection tube 62 is attached to a sidewall 64 of the quartz tube 12 proximate to the flanged end 22 for injecting a deposition gas into the lower portion 26 of the interior chamber of the quartz tube 12. The lower gas injection tube 62 enters the lower portion 26 of the interior chamber at proximal end 66 and extends toward the upper portion 24 of the interior chamber to a distal end 68. The lower gas injection tube 62 preferably extends a predetermined distance upwardly through the quartz tube toward the upper portion 24 such that the distal end 68 of the injection tube 62 is proximate the top of the pedestal 42, as shown. In a preferred embodiment, the lower gas injection tube extends upwardly for a distance of approximately 10 inches, or less than approximately one-third the length of the quartz tube 12. Further, an inlet 70 is provided in the distal end 68 of the injection tube 62 for injecting the deposition gas into the interior chamber. The inlet 70 is preferably facing the sidewall 64 so that the deposition gas is injected in a direction substantially toward the sidewall 64.

The deposition gas injected into the interior chamber of quartz tube 12 via the gas injection tubes 60,62 is drawn out of the interior chamber of quartz tube 12 by a dual flange plenum 72. In addition, nitrogen may be periodically injected into the interior chamber via the gas injection tubes 60,62 to purge the interior chamber of the quartz tube 12.

Accordingly, by attaching the lower gas injection tube 62 to the quartz tube 12 proximate the flanged end 22 so that the lower gas injection tube 62 enters the interior chamber at the lower portion 24 thereof, the length of the lower gas injection tube 62 that is exposed inside the interior chamber can be significantly reduced as compared to conventional designs. In this regard, the length of the lower gas injection tube 62 within the interior chamber of the quartz tube is reduced relative to conventional designs since the inlet 70 is preferably adjacent the top of the pedestal 42 (i.e., at the base of the wafer boat 40), which is closer to the lower portion 26 than the upper portion 24 of the interior chamber.

Advantages of the lower gas injection tube design of the present invention include educed polysilicon film buildup on the interior surfaces of the lower gas injection tube 62 since the injection tube is shorter and remains cooler. Since less polysilicon film buildup will be deposited on the interior surfaces of the gas injection tube, the gas injection tube should have fewer cracks and breaks, thereby reducing maintenance costs and increasing product yield. In addition, the reduction in polysilicon film deposition also may reduce gas depletion, which means the gas flow required for the same growth can be reduced. In fact, it has been empirically determined that the gas flow can be reduced as much as 5% when using the lower gas injection tube design of the present invention, as compared to a top-mounted lower gas injection tube of the conventional design. Further, there may exist a cost reduction in fabricating a LPCVD furnace 10 with the lower gas injection tube 62 of the present invention because it is less expensive to fabricate a lower gas injection tube 62 attached to a side wall of the quartz tube 12 than to fabricate a lower gas injection tube attached to the belled end 20. The conventional design may also be more expensive because, among other things, it is more difficult to align the longer injection tube within the interior chamber, especially when the injection tube is attached to the belled end of the quartz tube 12.

With reference to FIGS. 2 and 3, illustrated is a quartz pedestal configured for operation in connection with the lower gas injection tube design of the present invention, as described hereinbefore and as illustrated in FIG. 1. In particular, the quartz pedestal 42 includes a first end plate 76 and a second end plate 78. The end plates 76,78 are interconnected by a plurality of essentially parallel rods 80 extending between the first end plate 76 and the second end plate 78. The rods 80 are preferably positioned in a spaced apart relationship around the peripheral edges of respective end plates 76,78. The pedestal also includes a cover 82 surrounding portions of the rods 80 adjacent the first end plate 76 and extending only partially toward the second end plate 78, as shown. The cover 82 acts as a deflector for minimizing airflow disturbances at the base of the wafer boat 40. An outwardly facing channel 84 is provided within the cover 82 and a corresponding notch is defined by the first end plate 76. The channel 84 and notch are configured to partially surround the lower gas injection tube 62, as illustrated in FIG. 1. Thus, the channel 84 and notch are essentially concentrically aligned with the lower gas injection tube 62 so that the channel 84 and notch receive the lower gas injection tube 62 when the pedestal 42 is raised into the quartz tube 12 by the elevator door 52.

One or more of the alignment pins 50 are preferably attached to the first end plate 76 for aligning the wafer boat 40 thereon. In particular, the alignment pins 50 are of a sufficient length so that the pins mate with corresponding openings in the base of the wafer boat 40 for defining the orientation of the wafer boat within the quartz tube 12. Further, two or more leveling recesses 82 are provided in the end plate 76 to ensure precise vertical alignment of the wafer boat 40 within the quartz tube 12. The leveling recesses 82 are machined to a much more exacting standard than the adjacent surfaces of the first end plate 76, and therefore, ensure that the wafer boat is precisely aligned within the quartz tube 12. As shown in FIG. 1, the leveling recesses 82 receive the feet 46 of wafer boat 40.

An advantage of the pedestal 42 is that it can be easily cleaned in a chemical bath since the pedestal does not include a baffling system as do many of the conventional pedestal designs. Further, since the cover 82 does not extend all the way to the second end plate 78, the interior of space between the end plates 76, 78 is readily accessible. The pedestal 42 also is relatively simple to manufacture and durable in structure.

The foregoing is illustrative of the present invention and is not to be construed as limiting thereof. Although a few exemplary embodiments of this invention have been described, those with skill in the art would readily appreciate that many modifications and variations are possible in the exemplary embodiments without materially departing from the novel teachings and advantages of this invention. Accordingly, all such modifications and variations are intended to be included within the scope of this invention as defined in the claims.

Wherefore, the following is claimed:

1. A method for injecting a gas into a low pressure chemical vapor deposition (LPCVD) furnace, wherein said LPCVD furnace includes a quartz tube having an interior chamber that includes a lower portion and an upper portion, the method comprising the steps of:

providing a gas injection tube that enters the LPCVD furnace at the lower portion of the interior chamber and extends toward the upper portion of the interior chamber;

providing a pedestal positioned at the lower portion of the interior chamber and configured to receive the gas injection tube;

placing a plurality of wafers in the LPCVD furnace;

heating the LPCVD furnace; and injecting the gas into the LPCVD furnace utilizing the gas injection tube such that the gas flows upwardly through the gas injection tube prior to injection into the interior chamber of the LPCVD furnace.

2. The method of claim 1, further comprising the step of providing a heating element assembly substantially surrounding the quartz tube.

3. The method of claim 2, wherein the step of providing the heating element assembly includes the step of providing a heating element assembly that extends from a bottom portion proximate the lower portion of the quartz tube to a top portion proximate the upper portion of the quartz tube, and wherein said gas injection tube said bottom portion of said heating element assembly.

4. The method of claim 1, wherein the step of injecting gas includes injecting the gas into the interior chamber in a direction substantially toward a sidewall of the interior chamber.

5. The method of claim 1, further comprising the step of injecting a substance into the interior chamber, subsequent to the step of injecting the gas into the LPCVD furnace, wherein the substance purges the interior chamber of the injected gas.

6. The method of claim 1, wherein the step of providing a pedestal includes providing a pedestal having an outwardly facing channel for receiving said gas injection tube.

7. A method for injecting gas into a low pressure chemical vapor deposition (LPCVD) furnace, wherein said LPCVD furnace includes a quartz tube having an interior chamber including a lower portion and an upper portion, and further including a pedestal positioned at the lower portion of the chamber, the method comprising the steps of:

providing a gas injection tube that enters the LPCVD furnace at the lower portion of the interior chamber and extends to a point proximate the pedestal;

placing a plurality of wafers in the LPCVD furnace proximate to the upper portion of the interior chamber;

heating the LPCVD furnace; and injecting the gas into the LPCVD furnace utilizing the gas injection tube such that the gas flows upwardly through the gas injection tube prior to injection into the interior chamber of the LPCVD furnace.

8. The method of claim 7, wherein the pedestal includes a first end plate and a second end plate connected by a plurality of rods, and wherein the step of providing the gas injection tube comprises providing a gas injection tube that extends to a point proximate the first end plate.

9. The method of claim 8, wherein the pedestal further includes a cover surrounding those portions of the rods adjacent said first end plate, and including an outwardly facing channel defined by the cover for receiving the gas injection tube extending into the LPCVD furnace, and wherein the step of providing the gas injection tube comprises providing the gas injection tube that is received in the outwardly facing channel of the pedestal.

10. The method of claim 7, wherein the step of injecting gas into the LPCVD furnace includes injecting the gas into the LPCVD furnace through an outlet of the gas injection tube at the point proximate to the pedestal.

* * * * *